US012785675B2

(12) United States Patent
Kisu

(10) Patent No.: US 12,785,675 B2
(45) Date of Patent: Nov. 3, 2026

(54) SEMICONDUCTOR DEVICE COMPRISING A FIRST SWITCHING ELEMENT AND A SECOND SWITCHING ELEMENT, WHEREIN ON-VOLTAGE OF THE SECOND SWITCHING ELEMENT IS LOWER THAN ON-VOLTAGE OF THE FIRST SWITCHING ELEMENT AND SWITCHING SPEED OF THE SECOND SWITCHING ELEMENT IS LOWER THAN SWITCHING SPEED OF THE FIRST SWITCHING ELEMENT

(71) Applicant: Mitsubishi Electric Corporation, Tokyo (JP)

(72) Inventor: Koichiro Kisu, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 177 days.

(21) Appl. No.: 18/703,476

(22) PCT Filed: Jan. 20, 2022

(86) PCT No.: PCT/JP2022/001955
§ 371 (c)(1),
(2) Date: Apr. 22, 2024

(87) PCT Pub. No.: WO2023/139720
PCT Pub. Date: Jul. 27, 2023

(65) Prior Publication Data
US 2025/0240010 A1 Jul. 24, 2025

(51) Int. Cl.
*H03K 17/14* (2006.01)
*H02M 7/00* (2006.01)
(Continued)

(52) U.S. Cl.
CPC ............ *H03K 17/14* (2013.01); *H02M 7/003* (2013.01); *H02M 7/537* (2013.01); *H03K 17/005* (2013.01)

(58) Field of Classification Search
CPC ..... H03K 17/005; H03K 17/14; H02M 7/003; H02M 7/537
(Continued)

(56) References Cited

U.S. PATENT DOCUMENTS

2004/0042139 A1* 3/2004 Belverde .......... H03K 17/08128 361/100
2010/0182094 A1* 7/2010 Nasu ...................... H03B 5/366 331/116 FE
2017/0302181 A1* 10/2017 Shimizu .............. H02M 7/5387

FOREIGN PATENT DOCUMENTS

AU 2010356426 A1 * 1/2013 ............ B60L 15/007
EP 2242179 A1 * 10/2010 ....... H03K 17/08128
(Continued)

OTHER PUBLICATIONS

International Search Report issued in PCT/JP2022/001955; mailed Apr. 5, 2022.

*Primary Examiner* — Yemane Mehari
(74) *Attorney, Agent, or Firm* — Studebaker Brackett PLLC

(57) ABSTRACT

A semiconductor device includes an inverter circuit in which a first IGBT being a first switching element, and a second IGBT being a second switching element, are connected in series. The On-voltage of the second IGBT is lower than the On-voltage of the first IGBT. The switching speed of the second IGBT is lower than the switching speed of the first IGBT. The wiring impedance of the second main current path from the output terminal to the second input terminal via the second IGBT is higher than the wiring impedance of the first main current path from the first input terminal to the
(Continued)

output terminal via the first IGBT. The resistance value of the second external gate resistance connected to the gate electrode of the second IGBT is lower than the resistance value of the first external gate resistance connected to the gate electrode of the first IGBT.

8 Claims, 3 Drawing Sheets

(51) Int. Cl.
*H02M 7/537* (2006.01)
*H03K 17/00* (2006.01)

(58) Field of Classification Search
USPC .......................................................... 363/123
See application file for complete search history.

(56) References Cited

FOREIGN PATENT DOCUMENTS

| | | | | |
|---|---|---|---|---|
| EP | 1553687 B1 * | 7/2016 | ............... | E02B 3/12 |
| JP | H06-86569 A | 3/1994 | | |

* cited by examiner

SEMICONDUCTOR DEVICE COMPRISING A FIRST SWITCHING ELEMENT AND A SECOND SWITCHING ELEMENT, WHEREIN ON-VOLTAGE OF THE SECOND SWITCHING ELEMENT IS LOWER THAN ON-VOLTAGE OF THE FIRST SWITCHING ELEMENT AND SWITCHING SPEED OF THE SECOND SWITCHING ELEMENT IS LOWER THAN SWITCHING SPEED OF THE FIRST SWITCHING ELEMENT

TECHNICAL FIELD

The present disclosure relates to a semiconductor device.

BACKGROUND ART

Inverter circuits having upper and lower arms formed by connecting switching elements in series are widely known. For example, Patent Document 1 discloses a technique in which, in an inverter circuit with upper and lower arms, a low On loss Insulated Gate Bipolar Transistor (IGBT) with a low On-voltage is used as the switching element that performs switching in response to a long-period signal, and a low switching loss IGBT with a high switching speed is used as the switching element that performs switching in response to a short-period signal are used to reduce power loss in each of the upper and lower arms. As described in Patent Document 1, IGBTs for low On loss and IGBTs for low switching loss can be manufactured separately by performing lifetime control during the IGBT manufacturing process.

PRIOR ART DOCUMENTS

Patent Document(s)

[Patent Document 1] Japanese Patent Application Laid-Open No. 06-086569

SUMMARY

Problem to be Solved by the Invention

In Patent Document 1, no consideration is given to the difference in wiring impedance between the input terminal and output terminal of the upper arm and the wiring impedance between the input terminal and output terminal of the lower arm. Therefore, even if a low On loss IGBT is used as the switching element on the long-period signal side, the On-voltage of the current path increases due to the wiring impedance between the input terminal and output terminal connected thereto, the loss reduction effect to be obtained is insufficient, causing a loss difference between the upper and lower arms, posing a concern about the uneven heat generation distribution.

The present disclosure has been made to solve the problems described above, and an object thereof is to provide a semiconductor device capable of mitigating a loss difference between the upper and lower arms in the inverter circuit.

Means to Solve the Problem

According to the present disclosure, a semiconductor device includes an inverter circuit including a first switching element and a second switching element connected in series, a first input terminal being an external connection terminal connected to one main electrode of the first switching element, a second input terminal being an external connection terminal connected to one main electrode of the second switching element, an output terminal being an external connection terminal connected to a connection node between the first switching element and the second switching element, a first main current path being a current path from the first input terminal to the output terminal via the first switching element, a second main current path being a current path from the output terminal to the second input terminal via the second switching element, a first gate resistance connected to the gate electrode of the first switching element, and a second gate resistance connected to the gate electrode of the second switching element, in which On-voltage of the second switching element is lower than On-voltage of the first switching element, switching speed of the second switching element is lower than switching speed of the first switching element, wiring impedance of the second main current path is higher than wiring impedance of the first main current path, and a resistance value of the second gate resistance is lower than a resistance value of the first gate resistance.

Effects of the Invention

According to the semiconductor device of the present disclosure, the loss difference between the upper and lower arms of the inverter circuit is mitigated.

The objects, features, aspects, and advantages of the present disclosure will become more apparent from the following detailed description and the accompanying drawings.

DESCRIPTION OF EMBODIMENT(S)

Embodiment 1

Figure 1:
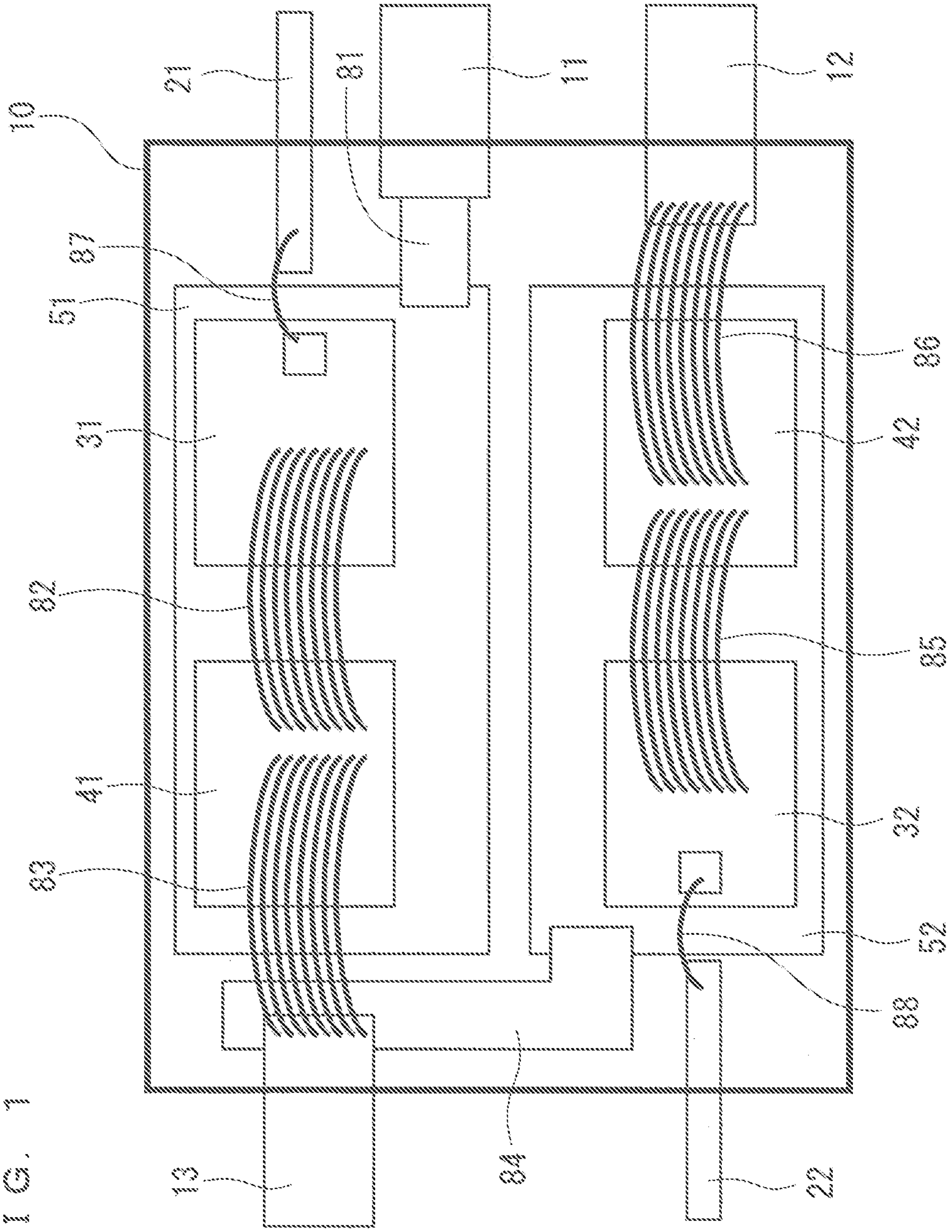
FIG. 1 A diagram illustrating a schematic configuration of a semiconductor device according to Embodiment 1.
Figure 2:
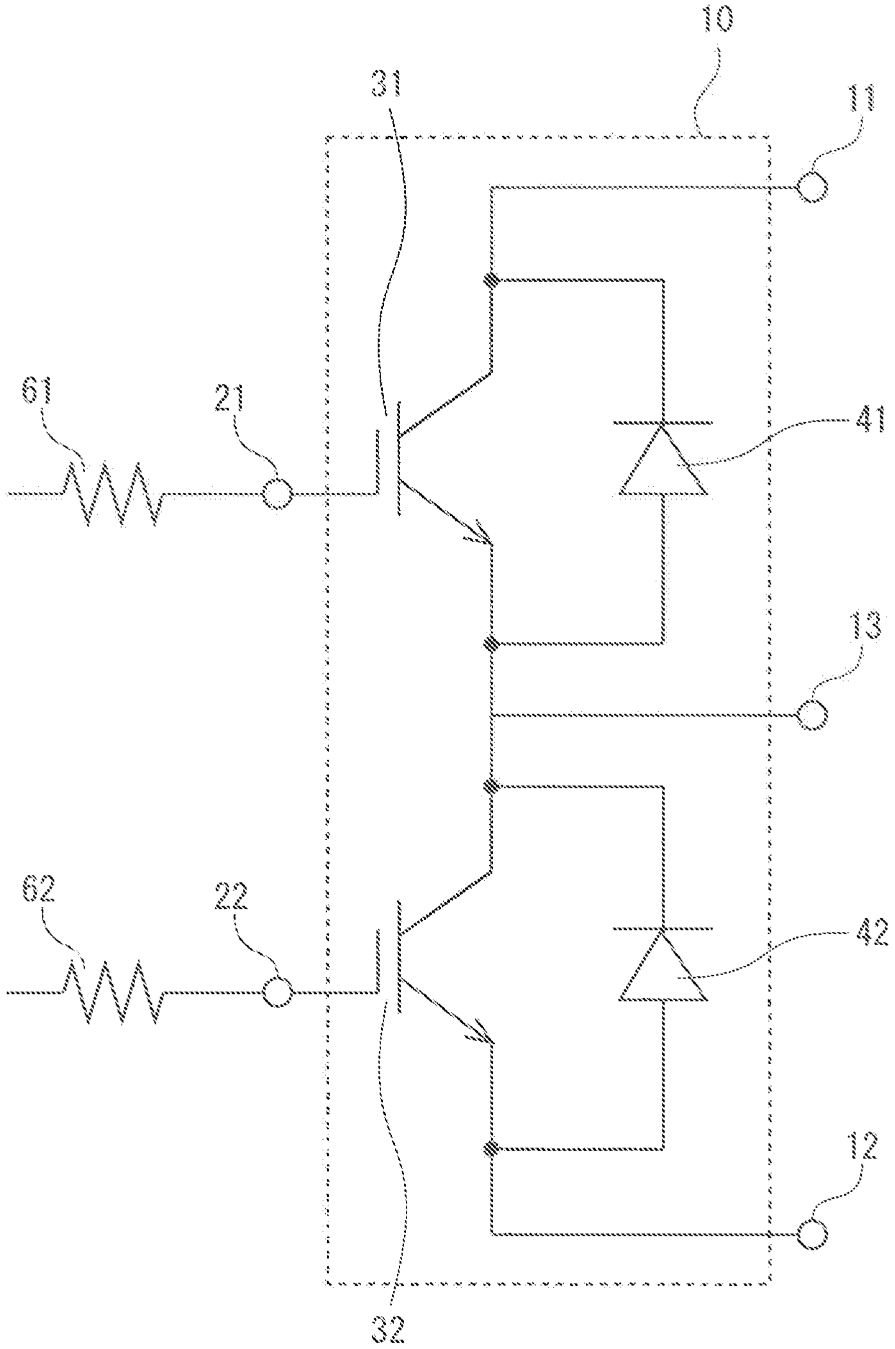
FIG. 2 A circuit diagram of the semiconductor device according to Embodiment 1.

FIG. 1 is a diagram of a semiconductor device 10 according to Embodiment 1. And FIG. 2 is a circuit diagram of the semiconductor device 10. Note that the same reference numerals are given to mutually corresponding elements in FIGS. 1 and 2.

As shown in FIG. 2, the semiconductor device 10 includes an inverter circuit having upper and lower arms in which a first IGBT 31 being a first switching element, and a second IGBT 32 being a second switching element, are connected in series. Also, a first diode 41 is connected in antiparallel to the first IGBT 31 on the upper arm side. A second diode 42 is connected in antiparallel to the second IGBT 32 on the lower arm side.

The semiconductor device 10 also includes a first input terminal 11, a second input terminal 12, and an output terminal 13 as main current terminals connected to the outside. The first input terminal 11 is an input terminal on the upper arm side, and is connected to a collector electrode being one of the main electrodes of the first IGBT 31. The second input terminal 12 is an input terminal on the lower arm side, and is connected to an emitter electrode being one of the main electrodes of the second IGBT 32. The output terminal 13 is connected to a connection node between the emitter electrode being the other main electrode of the first IGBT 31 and the collector electrode being the other main electrode of the second IGBT 32.

The semiconductor device 10 also includes a first gate signal input terminal 21 and a second gate signal input terminal 22 as control terminals connected to the outside. The first gate signal input terminal 21 is connected to the gate electrode of the first IGBT 31. The second gate signal input terminal 22 is connected to the gate electrode of the second IGBT 32.

As shown in FIG. 1, in the actual semiconductor device 10, a first base plate 51 on which the first IGBT 31 and the first diode 41 are mounted is arranged between the first input terminal 11 and the output terminal 13, and the collector electrode of the first IGBT 31 and a cathode electrode of the first diode 41 are connected to the first base plate 51. The first base plate 51 is connected to the first input terminal 11 via internal wiring 81. The emitter electrode of the first IGBT 31 and an anode electrode of the first diode 41 are connected via internal wiring 82. The anode electrode of the first diode 41 is connected to the output terminal 13 via internal wiring 83.

Further, a second base plate 52 on which the second IGBT 32 and the second diode 42 are mounted is arranged between the output terminal 13 and the second input terminal 12, and the collector electrode of the second IGBT 32 and a cathode electrode of the second diode 42 are connected to the second base plate 52. The second base plate 52 is connected to the output terminal 13 via internal wiring 84. The emitter electrode of the second IGBT 32 and an anode electrode of the second diode 42 are connected via internal wiring 85. The anode electrode of the second diode 41 is connected to the second input terminal 12 via internal wiring 86.

The gate electrode of the first IGBT 31 is connected to the first gate signal input terminal 21 via internal wiring 87. The gate electrode of the second IGBT 32 is connected to the second gate signal input terminal 22 via internal wiring 88.

In Embodiment 1, as shown in FIG. 2, a first external gate resistance 61 being an external resistance externally connected to the first gate signal input terminal 21, is used as the gate resistance of the first IGBT 31. Also, a second external gate resistance 62 being an external resistance externally connected to the second gate signal input terminal 22, is used as the gate resistance of the second IGBT 32.

Here, the current path on the upper arm side, that is, the current path from the first input terminal 11 to the output terminal 13 via the first IGBT 31 is defined as the "first main current path", and the current path on the lower arm side, that is, the current path from the output terminal 13 to the second input terminal 12 via the second IGBT 32 is defined as a "second main current path". In the semiconductor device 10 having the configuration shown in FIG. 1, the first main current path is formed by the first base plate 51, the first IGBT 31, the first diode 41, and the internal wiring 81 to 83 connected between the first input terminal 11 and the output terminal 13. Also, the second main current path is formed by the second base plate 52, the second IGBT 32, the second diode 42, and the internal wiring 84 to 86 connected between the output terminal 13 and the second input terminal 12.

In Embodiment 1, with lifetime control, the on-voltage and switching speed of each of the first IGBT 31 and the second IGBT 32 are set such that the On-voltage between the collector and the emitter of the second IGBT 32 is lower than the On-voltage between the collector and the emitter of the second IGBT 31, and the switching speed of the second IGBT 32 is lower than the switching speed of the first IGBT 31. That is, in the relationship between the first IGBT 31 and the second IGBT 32, the first IGBT 31 is a low switching loss IGBT with a high switching speed, and the second IGBT 32 is a low On loss IGBT with a low on-voltage.

Further, the wiring impedance of each of the first IGBT 31 and the second IGBT 32 is set such that the wiring impedance of the second main current path passing through the second IGBT 32 becomes higher than the wiring impedance of the first main current path passing through the first IGBT 31. Further, the resistance value of each of the first external gate resistance 61 and the second external gate resistance 62 are set such that the resistance value of the second external gate resistance 62 being the gate resistance of the second IGBT 32 is lower than the resistance value of the first external gate resistance 61 being the gate resistance of the first IGBT 31.

The On-voltage, switching speed, and gate resistance of each of the first IGBT 31 and the second IGBT 32, and the wiring impedance of each of the first main current path and the second main current path, are set to satisfy the relationship described above, thereby, diminishing the difference in On-voltage between the first main current path and the second main current path, and furthermore, reducing the switching loss of the second IGBT 32, which has increased due to lifetime control. Accordingly, the loss difference between the first main current path on the upper arm side and the second main current path on the lower arm side can be diminished. Consequently, the heat generation distribution in the semiconductor device 10 is made uniform, contributing to improving the reliability of the semiconductor device 10.

Embodiment 2

In Embodiment 2, the relationship between the first diode 41 and the On-voltage between the anode and the cathode of the first diode 41 is also set for the semiconductor device 10 of Embodiment 1.

In Embodiment 2, a diode with low On-voltage between the anode and the cathode is used for the second diode 42 connected to the second main current path with high wiring impedance, and a diode with high On-voltage between the anode and the cathode is used for the first diode 41 connected to the first main current path with low wiring impedance. That is, the On-voltage of the second diode 42 is set to be lower than the On-voltage of the first diode 41.

According to Embodiment 2, the loss difference between the first main current path on the upper arm side and the second main current path on the lower arm side can be further diminished.

Embodiment 3

Figure 3:
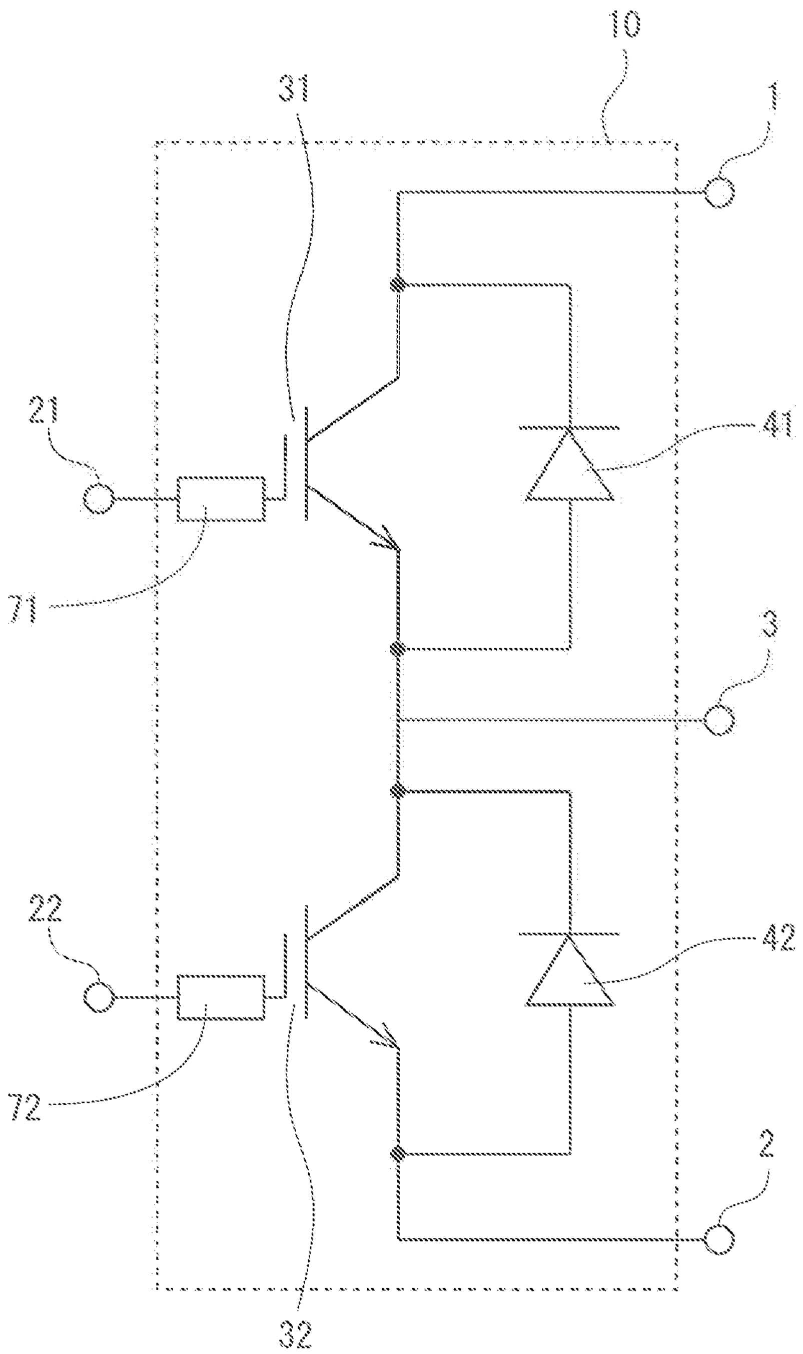
FIG. 3 A circuit diagram of a semiconductor device according to Embodiment 3.

FIG. 3 is a circuit diagram of a semiconductor device 10 according to Embodiment 3. Note that the structure of the semiconductor device 10 according to Embodiment 3 is the same as that in FIG. 1, and corresponding elements in FIG. 1 and FIG. 3 are given the same reference numerals.

In Embodiment 3, as shown in FIG. 3, a first built-in gate resistance 71 being a built-in resistance built into the chip of the first IGBT 31, is used as the gate resistance of the first IGBT 31. Also, a second built-in gate resistance 72 being a built-in resistance built into the chip of the second IGBT 32, is used as the gate resistance of the second IGBT 32. The resistance values of the first built-in gate resistance 71 and the second built-in gate resistance 72 are set such that the resistance value of the second built-in gate resistance 72 is smaller than the resistance value of the first built-in gate resistance 71.

Also in Embodiment 3, the same effects as in Embodiment 1 can be obtained. Further, another effect to be obtained is that no necessity is required to connect the gate resistances of the first IGBT 31 and the second IGBT 32 to the outside of the semiconductor device 10.

Embodiment 4

In Embodiment 4, as the gate resistance of the first IGBT 31, the resistance of the internal wiring 87 connecting between the gate electrode of the first IGBT 31 and the first gate signal input terminal 21 is used, and as the gate resistance of the second IGBT 32, the resistance of the internal wiring 88 connecting between the gate electrode of the second IGBT 32 and the second gate signal input terminal 22 is used. The resistance value of the internal wiring 88 is set lower than the resistance value of the internal wiring 87 so that the resistance value of the gate resistance of the second IGBT 32 is lower than the resistance value of the gate resistance of the first IGBT 31. For example, in a case where the internal wiring 87 and the internal wiring 88 are wires made of the same material, the length of the internal wiring 88 may be made shorter than the wiring length of the internal wiring 87.

Also in Embodiment 4, the same effects as in Embodiment 1 can be obtained. Further, other effects to be obtained are that no necessity is required to connect the gate resistances of the first IGBT 31 and the second IGBT 32 to the outside of the semiconductor device 10, and to incorporate the first built-in gate resistance 71 and the second built-in gate resistance 72 in the first IGBT 31 and the second IGBT 32, respectively.

The configurations of the gate resistances of the first IGBT 31 and the second IGBT 32 may be different from each other. for example, any one of the gate resistances shown in Embodiments 1, 3, and 4 may be adopted as the gate resistance of one of the first IGBT 31 and the second IGBT 32, and any one of the gate resistances shown in Embodiments 1, 3, and 4 may be adopted as the other gate resistance.

Although in above Embodiments, the switching elements constituting the inverter circuit are IGBTs, Metal-Oxide-Semiconductor Field-Effect Transistors (MOSFETs), may also be adoptable, for example. Further, the diodes connected in antiparallel to the switching elements may be Schottky barrier diodes or PN diodes.

Further, the switching elements and the diodes may be formed using a silicon (Si) semiconductor, for example, or may be formed using a wide bandgap semiconductor such as SiC, gallium nitride-based material, or diamond. A semiconductor device using a wide bandgap semiconductor is superior in operation at high voltages, large currents, and high temperatures, compared to a semiconductor device using silicon.

It should be noted that Embodiments can be arbitrarily combined and can be appropriately modified or omitted.

While the forgoing description is in all aspects illustrative and not restrictive, it is therefore understood that numerous undescribed modifications and variations can be devised.

EXPLANATION OF REFERENCE SIGNS

10 semiconductor device, 11 first input terminal, 12 second input terminal, 13 output terminal, 21 first gate signal input terminal, 22 second gate signal input terminal, 31 first IGBT, 32 second IGBT, 41 first diode, 42 second diode, 51 first base plate, 52 second base plate, 61 first external gate resistance, 62 second external gate resistance, 71 first built-in gate resistance, 72 second built-in gate resistance, 81 to 88 internal wiring.

The invention claimed is:

1. A semiconductor device comprising:

an inverter circuit including a first switching element that performs switching in response to a short-period signal and a second switching element that performs switching in response to a long-period signal connected in series;

a first input terminal being an external connection terminal connected to one main electrode of the first switching element;

a second input terminal being an external connection terminal connected to one main electrode of the second switching element;

an output terminal being an external connection terminal connected to a connection node between the first switching element and the second switching element;

a first main current path being a current path from the first input terminal to the output terminal via the first switching element;

a second main current path being a current path from the output terminal to the second input terminal via the second switching element;

a first gate resistance connected to the gate electrode of the first switching element; and a second gate resistance connected to the gate electrode of the second switching element, wherein On-voltage of the second switching element is lower than On-voltage of the first switching element, switching speed of the second switching element is lower than switching speed of the first switching element, wiring impedance of the second main current path is higher than wiring impedance of the first main current path, and a resistance value of the second gate resistance is lower than a resistance value of the first gate resistance.

2. The semiconductor device according to claim 1, further comprising:

a first diode connected in antiparallel to the first switching element; and a second diode connected in antiparallel to the second switching element, wherein the On-voltage of the second diode is lower than the on-voltage of the first diode.

3. The semiconductor device according to claim 1, wherein at least one of the first gate resistance and the second gate resistance is an external resistance externally connected to an external connection terminal connected to the gate electrode of the first switching element or the second switching element.

4. The semiconductor device according to claim 1, wherein at least one of the first gate resistance and the second gate resistance is a built-in resistance built into a chip of the first switching element or the second switching element.

5. The semiconductor device according to claim 1, wherein at least one of the first gate resistance and the second gate resistance is a resistance of internal wiring connecting the gate electrode of the first switching element or the second switching element and an external connection terminal to each other.

6. The semiconductor device according to claim 2, wherein at least one of the first gate resistance and the second gate resistance is an external resistance externally connected to an external connection terminal connected to the gate electrode of the first switching element or the second switching element.

7. The semiconductor device according to claim 2, wherein at least one of the first gate resistance and the second gate resistance is a built-in resistance built into a chip of the first switching element or the second switching element.

8. The semiconductor device according to claim 2, wherein at least one of the first gate resistance and the second gate resistance is a resistance of internal wiring connecting the gate electrode of the first switching element or the second switching element and an external connection terminal to each other.

* * * * *